(12) United States Patent
Manouvrier

(10) Patent No.: US 9,235,667 B2
(45) Date of Patent: Jan. 12, 2016

(54) SCR SIMULATION MODEL

(71) Applicant: STMicroelectronics SA, Montrouge (FR)

(72) Inventor: Jean-Robert Manouvrier, Saint Martin d'heres (FR)

(73) Assignee: STMICROELECTRONICS SA, Montrouge (FR)

( * ) Notice: Subject to any disclaimer, the term of this patent is extended or adjusted under 35 U.S.C. 154(b) by 376 days.

(21) Appl. No.: 13/852,162

(22) Filed: Mar. 28, 2013

(65) Prior Publication Data

US 2013/0262057 A1 Oct. 3, 2013

(30) Foreign Application Priority Data

Apr. 3, 2012 (FR) ...................................... 12 53032

(51) Int. Cl.
*G06F 17/50* (2006.01)
(52) U.S. Cl.
CPC .................................. *G06F 17/5036* (2013.01)
(58) Field of Classification Search
None
See application file for complete search history.

(56) References Cited

U.S. PATENT DOCUMENTS

2011/0166847 A1 7/2011 Li et al.

OTHER PUBLICATIONS

Lou et al., "A comprehensive compact SCR model for CDM ESD circuit simulation", IEEE International Reliability Physics Symposium, 2008, pp. 635-636.*

Di Sarro et al., "A Scalable SCR Compact Model for ESD Circuit Simulation". Reliability Physics Symposium, 2008, IRPS 2008. IEEE International, IEEE, Piscataway, NJ, USA, Apr. 27, 2008, pp. 254-261, XP031283178, ISBN: 978-1-4244-2049-0.
Romanescu et al., "A Novel Physical Model for the SCR ESD Protection Device". Electrical Overstress/Electrostatic Discharge Symposium (EOS/ESD), 2010 32nd, IEEE, Piscataway, NJ, USA, Oct. 3, 2010, pp. 1-10, XP031791621, ISBN: 978-1-58537-182-2.
Lou et al., "Silicon Controlled Rectifier (SCR) Compact Modeiling Based on VBIC and Gummel-Poon Models". Solid State Electronics, Elsevier Science Publishers, Barking, GB, vol. 53, No. 2, Feb. 1, 2009, pp. 195-203, XP025898424, ISSN: 0038-1101.
Romanescu et al., "Scalable Modeling Studies on SCR ESD Protection Device". Electrical Overstress/Electrostatic Discharge Symposium (EOS/ESD), 2011 33rd, IEEE, Anaheim, CA, USA, Sep. 11-16, 2011, pp. 1-8, ISBN: 978-1-58537-193-8.
Fonteneau et al., "Characterization and Modeling of SCR and NMOS Snpaback From DC Down to CDM Time Domain". International ESD Workshop—2008, STMicroelectronics, 25 pages.
Caillard et al., Electrical Modeling of LSCRs in Deep Submicron CMOS Technologies for Circuit-Level Simulation of ESD Protection Structures, BiPolar/BiCMOS Circuits and Technology Meeting, 2003. Proceedings of the Digital Object Identifier, pp. 97-100.

* cited by examiner

*Primary Examiner* — Omar Fernandez Rivas
*Assistant Examiner* — Herng-der Day
(74) *Attorney, Agent, or Firm* — Allen, Dyer, Doppelt, Milbrath & Gilchrist, P.A.

(57) ABSTRACT

A model for simulating the electrical behavior of a thyristor includes a model of an NPN bipolar transistor whose emitter forms the cathode of the thyristor and the base forms a low-side control terminal of the thyristor, and a model of a PNP bipolar transistor whose emitter forms the anode of the thyristor and the base forms a high-side control terminal of the thyristor, the collector of the PNP transistor being connected to the low-side control terminal and the collector of the NPN transistor being connected to the high-side control terminal. The transistor models are present a small signal behavior over the entire range of anode currents of the thyristor, whereby the transistor models exhibit a gain drop when the anode current exits the small signal range.

5 Claims, 3 Drawing Sheets

SCR SIMULATION MODEL

FIELD OF THE INVENTION

The invention is related to the electrical simulation of integrated circuits, especially of the behavior of thyristors (or SCRs) incorporated into the integrated circuits.

BACKGROUND OF THE INVENTION

FIG. 1A shows an equivalent circuit diagram of a conventional thyristor. It comprises an NPN bipolar transistor whose emitter forms the cathode C of the thyristor, and the base forms a low-side control terminal Pw. The collector of the NPN transistor is connected to the base of a PNP transistor. The base of the PNP transistor forms a high-side control terminal Nw. The emitter of the PNP transistor forms the anode A of the thyristor and the collector of the PNP transistor is connected to the base of the NPN transistor.

The thyristor is triggered (turned on) by drawing a current from the base of the PNP transistor through terminal Nw, or by injecting a current into the base of the NPN transistor through terminal Pw. Once the thyristor is triggered, it remains conductive even if the current through terminals Pw and Nw is canceled. Indeed, when the thyristor is on, the anode current is divided into two paths, one from the base of the PNP transistor to the collector of the NPN transistor, thereby maintaining the PNP transistor in its conductive state, and the other through the collector of the PNP transistor to the base of the NPN transistor, which maintains the NPN transistor in its conductive state.

FIG. 1B schematically shows a semiconductor structure of a conventional thyristor. A substrate Psub comprises two wells in lateral contact, a P-doped well Pwell, and an N-doped well Nwell. The top surface of well Pwell comprises an N+ doped region forming the cathode contact C, and a P+ doped region forming the low-side control terminal Pw. The top surface of well Nwell comprises, adjacent the cathode region C, a P+ doped region forming the anode contact A. The high-side control terminal Nw is formed by an N+ doped region of well Nwell. The N+ and P+ regions are separated by deep-trench insulations STI. Beneath the wells, there is a buried insulating layer Niso, and the remainder of substrate Psub.

The thyristor is formed in this structure by the junctions P-N-P-N going from the anode A to the cathode C. The NPN and PNP equivalent bipolar transistors are shown. Note that the two base-collector links between the transistors are actually formed in the single PN junction between the wells.

Thyristors are often used to protect integrated circuits against electrostatic discharges, and thus form part of the components that the designer may include in an integrated circuit. It may therefore be desirable that the electrical behavior of these thyristors can be simulated, as for the other components of the circuit, before finalizing the circuit for production.

The simulation of a thyristor involves difficulties. Indeed, in the case of a protection component, it is likely to be subjected to voltages and currents that are beyond the usual ranges of other circuit components.

In the so-called "small-signal" range, i.e. with currents and voltages within the normal circuit operation, the thyristor can be modeled by the two coupled transistors of the diagram of FIG. 1A.

However, once the thyristor is triggered, it is capable of short-circuiting low impedance terminals or deriving a voltage surge to ground, causing a current beyond the small signal range, i.e. beyond the validity limits of the original model. In the conventional small signal model of a bipolar transistor, the gain drops rapidly when the injection current, or collector current, exceeds a threshold. As a result, self-maintenance of the thyristor in its conducting state is no longer guaranteed beyond this threshold current.

FIG. 2 is a graph illustrating an exemplary evolution of the anode current $I_A$ as a function of the anode voltage $V_A$ (assuming the cathode voltage is zero) for a thyristor as it triggers.

The dotted curve corresponds to a real thyristor: upon triggering, the anode voltage falls rapidly to a minimum value while the anode current increases slightly. The thyristor then behaves as a low value resistance: the anode voltage increases slowly in proportion to the current.

The solid curve corresponds to a conventional small signal model: shortly after reaching the minimum anode voltage, the gains of the transistors fall rapidly. The right part of the figure shows the evolution of the gain $\beta_{NPN}$ of the NPN transistor. Initially, the gain is about 3.3. When this gain has fallen to a value close to 1, the transistors can no longer mutually maintain their conduction. The model tends to behave incorrectly as a low-value resistor in series with the voltage source supplying the anode.

The article ["Characterization and Modeling of SCR from DC down to CDM time domain", Pascal Fonteneau et al., IEW 2008] discloses a model with two bipolar transistors, modified so that there is no gain degradation. Small signal behavior of this model is unsatisfactory, however.

Others have studied "binary" models, where switching is implemented between a small signal model and a strong current model, such as the papers (1) "A Novel Physical Model for the SCR ESD Protection Device", Alexandru Romanescu et al., Electrical Overstress/Electrostatic Discharge Symposium (EOS/ESD), 2010 and (2) "Scalable Modeling Studies on the SCR ESD Protection Device", Alexandru Romanescu et al., EOS/ESD Symposium, 2011 33rd.

FIG. 3 schematically shows base elements of a model as described in the above Romanescu articles. Between the anode A and the cathode C, are successively connected: an anode resistor RA, an anode-N-well diode $D_{ANw}$ (forward biased for a current which would flow from the anode to the cathode), a reverse biased N-well-P-well diode $D_{NwPw}$, a forward biased P-well-cathode diode $D_{PwC}$, and a cathode resistor RC. Between the anode A and the low-side control terminal Pw, are successively connected: resistor RA, a current source ITp, and a resistor $R_{CTp}$. Between the high-side control terminal Nw and the cathode C, are successively connected: resistor $R_{CTn}$, a current source ITn and resistor RC. A variable resistor $R_{Bp}$ connects the cathode of diode $D_{ANw}$ to resistor $R_{CTn}$. A variable resistor $R_{Bn}$ connects the anode of diode $D_{PwC}$ to resistor $R_{CTp}$. A current source Ibk is connected in parallel with diode $D_{NwPw}$.

Except for the diodes, FIG. 3 uses the same component designations as article (2), so direct reference to the equations of this article may be made for more detail on the model behavior. Article (2) actually provides two diodes in parallel for each diode in FIG. 3, i.e. diodes designated IBFp and IREp for diode $D_{ANw}$, diodes designated IBC and IRC for diode $D_{NwPw}$, and diodes designated IBFn IREn for diode $D_{PwC}$.

The diodes model the PN junctions of the structure of FIG. 1B. The current amplifying function of the bipolar transistors is modeled by equations governing the current sources ITp and ITn based on the Gummel-Poon equations. In these equations, modifier functions were introduced, denoted HCCFn for the NPN transistor and HCCFp for the PNP transistor.

Each function HCCF is adjusted to switch the gain to a higher value when it reaches a value too low to maintain the thyristor on.

This approach requires the definition of several new parameters that have no physical meaning, e.g. the threshold, the slope and the magnitude of the gain switching. These parameters must be adjusted empirically, on a case-by-case basis. Since the switching function further introduces a discontinuity, simulations using this type of model may have convergence problems.

SUMMARY OF THE INVENTION

There is therefore a need for a thyristor simulation model that remains valid over a wide range of currents and which is simple to implement. It is also desirable that the model causes little convergence problems.

This need is addressed by a method for simulating the electrical behavior of an integrated circuit incorporating thyristors, using a thyristor model comprising an NPN bipolar transistor whose emitter forms the cathode of the thyristor and the base forms a low-side control terminal of the thyristor, and a PNP bipolar transistor whose emitter forms the anode of the thyristor and the base forms a high-side control terminal of the thyristor, with the collector of the PNP transistor being connected to the low-side control terminal and the collector of the NPN transistor being connected to the high-side control terminal. The transistor models are configured to present a small signal behavior over the entire range of anode currents of the thyristor, whereby the transistor models exhibit a gain drop when the anode current exits the small signal range. The thyristor model comprises a first compensation current source connected between the emitter and the collector of the NPN transistor, and a second compensation current source connected between the emitter and the collector of the PNP transistor. The laws of variation of the compensation current sources are selected so that the currents of the sources increase continuously as a function of the forward bias voltages of the base-emitter junctions of the two transistors, with an increasing growth rate such that the state of the thyristor remains stable when the gain of the transistors drops.

According to one embodiment, the laws of variation of the current sources correspond to equations expressing the evolution of a recombination current.

In some embodiments, the equations expressing the evolution of the recombination current are used with, as a variable, a linear combination of voltages $V_{ANw}$ and $V_{PwC}$, where $V_{ANw}$ is the voltage across the emitter-base junction of the PNP transistor and $V_{PwC}$ is the voltage across the base-emitter junction of the NPN transistor.

In some embodiments, the variable is the average of voltages $V_{ANw}$ and $V_{PwC}$.

BRIEF DESCRIPTION OF THE DRAWINGS

Other advantages and features will become more clearly apparent from the following description of particular embodiments of the invention provided for exemplary purposes only and represented in the appended drawings.

DETAILED DESCRIPTION OF THE PREFERRED EMBODIMENTS

In order to optimize a thyristor simulation model, it is proposed here to compensate for the gain drop of the bipolar transistors of a conventional small signal model by adding compensation currents to the collector currents of the transistors.

Figure 3:
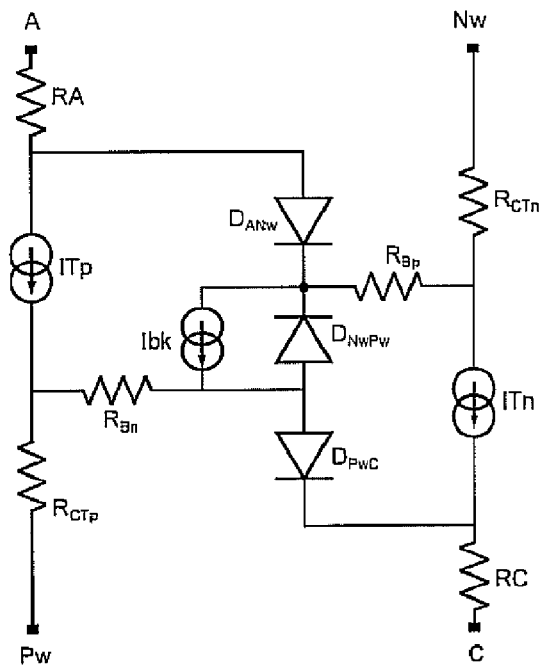
FIG. 3 shows an example of a conventional simulation model of a thyristor according to the prior art.
Figure 4:
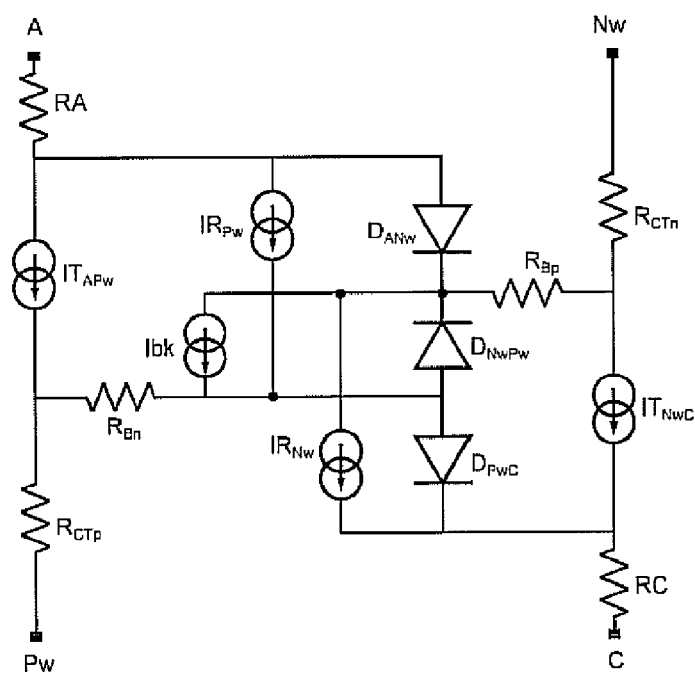
FIG. 4 shows an embodiment of an optimized thyristor simulation model according to the invention.

FIG. 4 schematically shows an example to achieve this. In a conventional small signal model of the type of FIG. 3, a current source $IR_{Pw}$ is connected between the anodes of diodes $D_{ANw}$ and $D_{NwPw}$, corresponding respectively to the emitter and the collector of the PNP transistor of the equivalent circuit. A current source $IR_{Nw}$ is connected between the cathodes of diodes $D_{NwPw}$ and $D_{PwC}$, corresponding respectively to the collector and the emitter of the NPN transistor of the equivalent circuit. The positive direction of the current flow of all current sources in FIG. 4 is top to bottom.

Current sources ITp and ITn in FIG. 3, modeling the amplifier function of the NPN and PNP transistors, have been renamed here $IT_{APw}$ and $IT_{Nwc}$. In contrast to the model described in connection with FIG. 3, these current sources are consistent with the conventional equations, i.e. they do not involve gain-modifying functions.

The variation law of each of the compensation current sources is chosen so that the current from the source grows continuously as a function of the forward bias voltage of junctions $D_{ANw}$ and $D_{NwPw}$, i.e. the current does not present a more or less abrupt step as it evolves. This promotes the convergence of the simulations.

Thus, this law is also in effect in the small signal range. To avoid distorting the behavior of the small signal model, the law is preferably configured to provide a compensating current that becomes significant only when the two junctions $D_{NwPw}$ and $D_{ANw}$ are forward biased. Thus, the compensation current remains negligible in the small signal range where only one of the two junctions is forward biased. The variation law is finally such that the compensation current reaches a value sufficient to maintain the thyristor in its conductive state when the gains of the transistors drop.

A law that can satisfy these constraints is a function with a slope that increases continuously as a function of the voltages of junctions $D_{ANw}$ and $D_{NwPw}$, like an increasing portion of a polynomial of degree greater than or equal to 2. The coefficients of the polynomial are, however, many parameters that would be adjusted empirically.

To reduce the number of parameters, it may be preferable to use a law that is representative of a real physical phenomenon, which can use known parameters. This may be achieved by selecting the law governing the carrier recombination phenomenon in a EN junction, i.e. an exponential law.

This phenomenon, in the junction between the wells Nwell and Pwell, which includes the two base-collector links between the NPN and PNP transistors, also happens to be one of the sources of errors when using high currents with a conventional small signal model. It is therefore adequate to compensate for these errors by a phenomenon of the same nature as that of their origin.

The forward current in a PN junction, e.g. diode $D_{ANw}$ forming the base-emitter junction of the PNP bipolar transistor, is expressed by Shockley's equation:

$$I = i_S \left( e^{\frac{V}{U_T}} - 1 \right)$$

Where V is the forward bias voltage of the junction, $U_T$ is the thermal voltage (of the order of 26 mV), and $i_S$ is the leakage saturation current of the junction (of the order of $10^{-17}$ A).

Similarly, the recombination current of the junction is given by:

$$IR = i_{SR} \left( e^{\frac{V}{N_R \cdot U_T}} - 1 \right)$$

Where $i_{SR}$ is the recombination saturation current of (in the order of 1000 times greater than current $i_S$), and $N_R$ is the recombination coefficient of the junction, between 1.5 and 2.5.

The collector current of a forward biased bipolar transistor is in turn defined by:

$$I_C = \frac{I_{TF}}{q_B}$$

Where $q_B$ is the normalized base charge of the bipolar transistor, responsible for the gain drop, and $I_{TF}$ is the forward transport current such as:

$$I_{TF} = i_{STF} \left( e^{\frac{V}{U_T}} - 1 \right)$$

Where V is the forward bias voltage of the base-emitter junction (NPN) or emitter-base junction (PNP), and $i_{STF}$ is the forward transport saturation current (in the order of $10^{-17}$ A).

Starting from this basis, the compensation currents may be expressed by:

$$IR_{Nw} = i_{SRNw} \left( e^{\left( \frac{V_{ANw}}{N_{Nw} \cdot U_T} + \frac{V_{PwC}}{N_{Pw} \cdot U_T} \right)} - 1 \right)$$

$$IR_{Pw} = i_{SRPw} \left( e^{\left( \frac{V_{ANw}}{N_{Nw} \cdot U_T} + \frac{V_{PwC}}{N_{Pw} \cdot U_T} \right)} - 1 \right)$$

Where $V_{ANw}$ is the voltage across diode $D_{ANw}$, in fact the emitter-base voltage of the PNP transistor, and $V_{PwC}$ the voltage across diode $D_{PwC}$, in fact the base-emitter voltage of the NPN transistor.

In a simplified version, which provides equally satisfactory results, it may be assumed that the coefficients $N_{Nw}$ and $N_{Pw}$ are equal to 2, and that the saturation currents of the compensation current sources are equal to the forward transport saturation currents of the bipolar transistors, which yields:

$$IR_{Nw} = i_{STF\_PNP} \left( e^{\left( \frac{V_{ANw} + V_{PwC}}{2U_T} \right)} - 1 \right)$$

$$IR_{Pw} = i_{STF\_NPN} \left( e^{\left( \frac{V_{ANw} + V_{PwC}}{2U_T} \right)} - 1 \right)$$

Where $I_{STF\_PNP}$ is the forward transport saturation current of the PNP bipolar transistor and $I_{STF\_NPN}$ the forward transport saturation current of the NPN bipolar transistor. The terms "−1" may be ignored.

Thus, when the two junctions $D_{ANw}$ and $D_{NwPw}$ are forward biased, the compensation current follows the same growth rate and the same intensity as the bipolar transport current while the collector current of the bipolar transistor, and thus the gain of the bipolar transistor, is degraded.

Under lower currents, when only one bipolar transistor is conductive, the compensation current follows the same growth rate as the recombination current, but at a much lower intensity (on the order of 1000 times less than the junction recombination current). Thus, the compensation current is negligible in the small signal range.

By establishing such variation laws, no parameter is introduced that is not already used in the conventional small signal model.

Figure 1A:
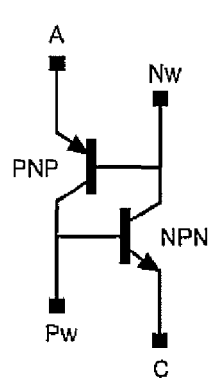
FIGS. 1A and 1B, described above, respectively show an equivalent circuit diagram of a thyristor and a schematic semiconductor realization of a thyristor according to the prior art.
Figure 1B:
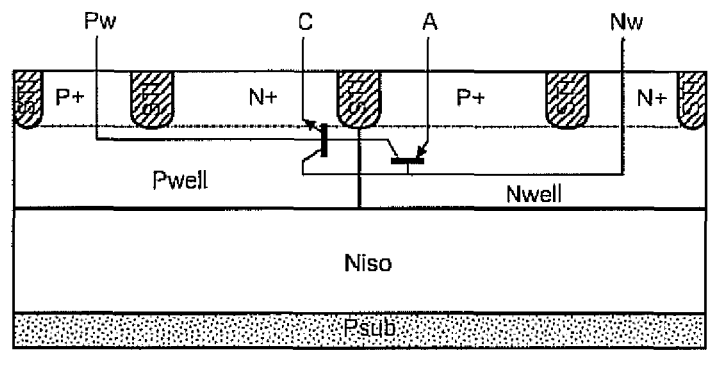
Figure 2:
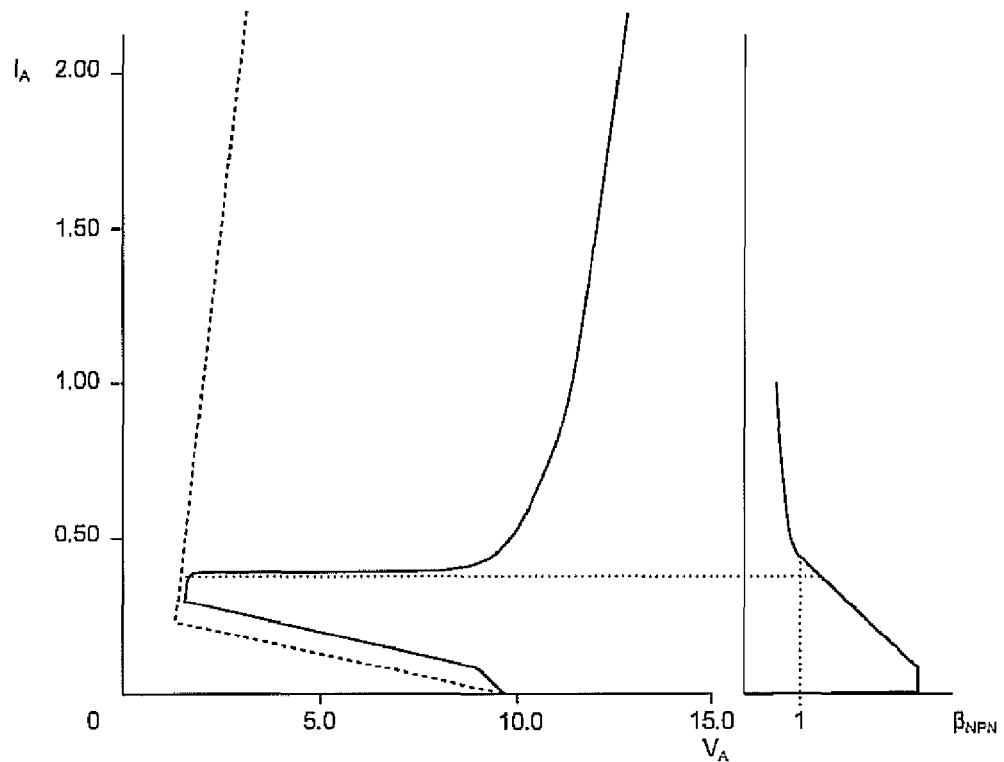
FIG. 2, described above, shows exemplary characteristics of a real thyristor and of a thyristor simulated according to a small signal model according to the prior art.
Figure 5:
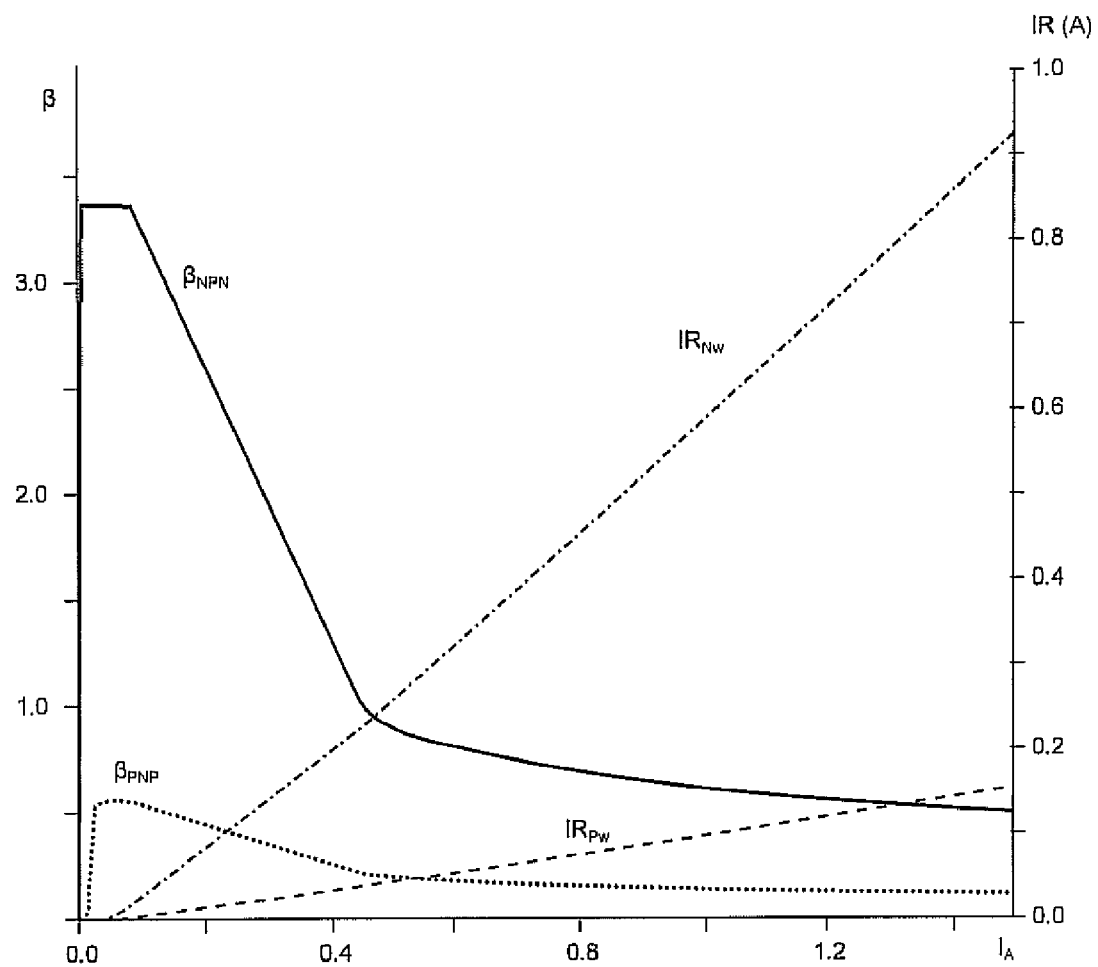
FIG. 5 is a graph illustrating the operation of the model in FIG. 4.

FIG. 5 is a graph illustrating the gain evolutions of the NPN and PNP transistors ($\beta_{NPN}$ and $\beta_{NPN}$ respectively) and of the compensation currents as a function of the anode current $I_A$, under the same conditions as in the graph of FIG. 2.

Note that the gains begin to drop from an anode current of 0.1 A, which corresponds in this context to the upper limit of the small signal range. At this point, the compensation currents start to become significant and provide the current differential that is lost because of the gain drop.

As illustrated in FIG. 2, when the gain of the NPN transistor is close to 1, around 0.4 A of anode current, the current was not sufficient for self-maintenance of the conducting state of the thyristor. Here, the compensation currents provide about half of the anode current, whereas the transistors provide the remainder. The transistors remain in the conductive state, and the lack of current due to the collapse of their gains is provided by the compensation current sources.

It is thus possible, at higher currents, to satisfactorily approximate the characteristic curve of the real thyristor shown in dotted lines in FIG. 2.

That which claimed:
1. A method of electrical simulation of an integrated circuit including at least one thyristor comprising:
   using a thyristor model for the electrical simulation of the at least one thyristor of the integrated circuit, the thyristor model comprising
      an NPN bipolar transistor having an emitter defining a cathode of the thyristor and a base defining a low-side control terminal of the thyristor,
      a PNP bipolar transistor having an emitter defining an anode of the thyristor and a base defining a high-side control terminal of the thyristor, and with a collector of the PNP bipolar transistor being coupled to the low-side control terminal and a collector of the NPN bipolar transistor being coupled to the high-side control terminal,
      a first compensation current source coupled between the emitter and the collector of the NPN bipolar transistor, and a second compensation current source coupled between the emitter and the collector of the PNP bipolar transistor; and wherein a law of variation of each of the first and second compensation current sources corresponds to an equation expressing an evolution of a recombination current, and is used with, as a variable, a linear combination of voltages $V_{ANw}$ and $V_{PwC}$, where $V_{ANw}$ is a voltage across an emitter-base junction of the PNP bipolar transistor and $V_{PwC}$ is a voltage across a base-emitter junction of the NPN bipolar transistor; and adjusting each of the first and second compensation current sources of the thyristor model based on the corresponding equation to compensate for a gain drop of the corresponding NPN and PNP bipolar transistors during the electrical simulation.

2. The method according to claim 1, wherein the variable is an average of voltages $V_{ANw}$ and $V_{PwC}$.

3. The method according to claim 1, wherein a current of each of the first and second compensation current sources is expressed by:

$$IR = i_{SR}\left(e^{\left(\frac{V_{ANw}}{N_{Nw} \cdot U_T} + \frac{V_{PwC}}{N_{Pw} \cdot U_T}\right)} - 1\right)$$

where $i_{SR}$ is a recombination saturation current, $N_{Nw}$ a recombination coefficient of the emitter-base junction of the PNP bipolar transistor, $N_{Pw}$ a recombination coefficient of the base-emitter junction of the NPN bipolar transistor, and $U_T$ a thermal voltage.

4. A method of simulation of a thyristor comprising:

using a thyristor model for the simulation based upon
an NPN bipolar transistor having an emitter defining a cathode of the thyristor and a base defining a low-side control terminal of the thyristor, a PNP bipolar transistor having an emitter defining an anode of the thyristor and a base defining a high-side control terminal of the thyristor, and with a collector of the PNP bipolar transistor being coupled to the low-side control terminal and a collector of the NPN bipolar transistor being coupled to the high-side control terminal, a first compensation current source coupled between the emitter and the collector of the NPN bipolar transistor, and a second compensation current source coupled between the emitter and the collector of the PNP bipolar transistor; and wherein a law of variation of each of the first and second current sources corresponds to an equation expressing an evolution of a recombination current comprising an average of voltages $V_{ANw}$ and $V_{PwC}$, where $V_{ANw}$ is a voltage across an emitter-base junction of the PNP bipolar transistor and $V_{PwC}$ is a voltage across a base-emitter junction of the NPN bipolar transistor; and adjusting each of the first and second compensation current sources of the thyristor model based on the corresponding equation to compensate for a gain drop of the corresponding NPN and PNP bipolar transistors during the simulation.

5. A method of simulation of a thyristor comprising:

using a thyristor model for the simulation based upon
an NPN bipolar transistor having an emitter defining a cathode of the thyristor and a base defining a low-side control terminal of the thyristor, a PNP bipolar transistor having an emitter defining an anode of the thyristor and a base defining a high-side control terminal of the thyristor, and with a collector of the PNP bipolar transistor being coupled to the low-side control terminal and a collector of the NPN bipolar transistor being coupled to the high-side control terminal, a first compensation current source coupled between the emitter and the collector of the NPN bipolar transistor, and a second compensation current source coupled between the emitter and the collector of the PNP bipolar transistor; and wherein a law of variation of each of the first and second current sources corresponds to an equation expressing an evolution of a recombination current, and a current of each compensation current source is expressed by:

$$IR = i_{SR}\left(e^{\left(\frac{V_{ANw}}{N_{Nw} \cdot U_T} + \frac{V_{PwC}}{N_{Pw} \cdot U_T}\right)} - 1\right)$$

where $i_{SR}$ is a recombination saturation current, $N_{Nw}$ a recombination coefficient of an emitter-base junction of the PNP bipolar transistor, $N_{Pw}$ a recombination coefficient of a base-emitter junction of the NPN bipolar transistor, and $U_T$ a thermal voltage; and adjusting each of the first and second compensation current sources based on the corresponding equation to compensate for a gain drop of the corresponding NPN and PNP bipolar transistors during the simulation.

\* \* \* \* \*